METHOD OF FORMING A SEMICONDUCTOR

Filed July 15, 1963 4 Sheets-Sheet 1

INVENTOR.
GARETH A. TRIPP
BY Roger S. Borovoy
ATTORNEY

METHOD OF FORMING A SEMICONDUCTOR

Filed July 15, 1963 4 Sheets-Sheet 2

INVENTOR.
GARETH A. TRIPP
BY Roger S. Borovoy
ATTORNEY

INVENTOR
GARETH A. TRIPP
BY Roger S. Borovoy
ATTORNEY

May 11, 1965 G. A. TRIPP 3,183,129

METHOD OF FORMING A SEMICONDUCTOR

Filed July 15, 1963 4 Sheets-Sheet 4

INVENTOR.
GARETH A. TRIPP
BY Roger S. Borovoy
ATTORNEY

United States Patent Office 3,183,129
Patented May 11, 1965

3,183,129
METHOD OF FORMING A SEMICONDUCTOR

Gareth A. Tripp, Palo Alto, Calif., assignor to Fairchild Camera and Instrument Corporation, Syosset, N.Y., a corporation of Delaware Filed July 15, 1963, Ser. No. 294,830
12 Claims. (Cl. 148—186)

Figure 1:
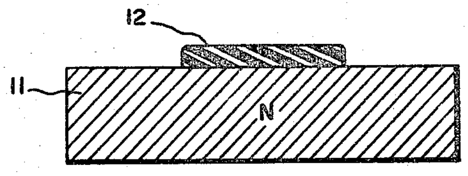

This application is a continuation-in-part of copending U.S. patent application Serial No. 62,717, filed October 14, 1960, now abandoned.

The present invention relates to an improved process of semiconductor device manufacture and more specifically, to the manufacture of diffused silicon devices of the flat surface type (called "planar") using the element gallium.

In the manufacture of semiconductor devices, such as simple transistors and diodes, controlled diffusion techniques are generally used to establish desired impurity concentrations. Devices are formed having rectifying junctions emergent upon a single surface, so that each different region on that surface is available for ohmic contact. With silicon devices, thermally grown silicon oxide provides a highly advantageous mask for limiting areas of diffusion. Although such masking is generally quite satisfactory, and is substantially impervious to most group III and group V semiconductor dopants or impurities, it has the serious limitation of being quite pervious to gallium. Gallium is a highly desirable dopant, in part because of its controllability and predictable behavior, and also because of its relative ease of handling. However, the inability of silicon oxide masking to exclude gallium from diffusing into wafer has precluded its use where oxide masking is employed.

It is recognized that certain semiconductor device configurations lend themselves to simplified successive diffusion operations where gallium may be employed. Thus, the "mesa" type transistor, for example, does not require precision masking during the base diffusion, for portions of the device are cut away to expose the underlying base region. One example of a prior art use of gallium as a diffusant in such a mesa transistor is found in Derick et al. U.S. Patent No. 2,802,760. Derick et al. diffuse regions having a high concentration of N-type impurities into their N-type wafer to form emitter regions. Gallium is then diffused over the entire surface of the wafer (including the previously diffused emitter regions) to a depth appreciably below the lowermost extremity of the emitter regions. Because of the excessive concentration of donor impurities present in the emitter regions, their conductivity type does not change as a result of the diffusion of the acceptor element gallium. Therefore, the process of Derick et al. produces two junctions: the first is the emitter-base junctions surrounding the emitter regions between them and the P-type gallium base region; and the second is between the P-type gallium base region and the N-type wafer substrate which forms the collector region. The second junction (collector-base) does not extend to the surface of the wafer. Consequently, in order to make contact with the collector region at the wafer surface, portions of the overlying base region are etched or "mesaed" away, leaving exposed a surface of the collector. Thus, a mesa transistor is produced.

Prior to this invention, there was no known way to make a planar transistor using gallium diffusion and oxide masking. Since gallium cannot be oxide-masked, there was no convenient way to limit the lateral extent of the gallium diffusion to leave portions of the surface area unaffected by the gallium diffusion. However, planar transistors and other planar semiconductor devices having each zone emergent at the top surface of the wafer do require both precision masking and precision diffusion. Precision masking, in the case of silicon, may be best performed using an integral oxide coating. And a precision uniform diffusion of a P-type region—particularly where a high resistivity region (low impurity concentration) is required—may best be performed using gallium.

In contradiction to the knowledge of the art, a new process has now been discovered for the formation of planar devices which makes possible both the use of gallium as a diffusant, and the use of oxide masking. In the basic process for making a planar transistor shown in U.S. Patent 3,025,589, issued to Jean Hoerni and assigned to the same assignee as this invention, gallium is expressly excluded from the usable group III elements because of its inability to be oxide masked. In planar devices of this invention, not only may gallium be advantageously employed along with oxide masking, but also the resulting devices have advantages over the structures made by the planar process of Hoerni. These advantages will be fully pointed out as the detailed description of the invention enfolds.

Briefly, the method of forming semiconductor devices by this invention comprises the steps of: (*a*) masking a portion of one surface of an N-type silicon wafer with silicon oxide to define the lateral extent of a desired P-type zone to be formed thereunder and to leave an exposed portion of the surface for the diffusion of a donor impurity; (*b*) diffusing a donor impurity which is masked by silicon oxide into the wafer from said surface to establish what will be called herein a "reciprocal region" in said wafer of a predetermined depth having additional donor impurities surrounding the masked portion of said wafer; and (*c*) controllably diffusing a sufficient amount of gallium into the wafer to establish a P-type zone in said wafer beneath said mask of depth less than said predetermined depth, the amount of such gallium diffused being insufficient to change the conductivity type of said reciprocal region from N-type to P-type, whereby a PN junction is formed between said P-type zone and said wafer, said junction extending to the wafer surface between said P-type zone and said reciprocal region; (*d*) masking the remainder of the surface of said wafer except a portion of the surface of said base region with silicon oxide, leaving an aperture in said mask over the base region for the diffusion of an emitter region; and (*e*) diffusing N-type impurities masked by silicon oxide into said aperture to form an emitter region of N-type conductivity, said emitter region forming a PN junction with said base region extending to said surface.

Since the gallium is not masked by oxide, there is no need to remove either the previous oxide masking, or any oxide which may have formed over the reciprocal region during its diffusion. The critical part of step (*c*), above, is that the gallium must be sufficiently diffused to assure formation of a P-type region in the final structure extending to a depth less than (or at most equal to) the depth of the reciprocal region diffusion. Otherwise, the desired structure will not result because the base region will spread across the entire wafer and not be laterally limited, as required, by the reciprocal region.

The regulation of the gallium depth may be accomplished by careful control of diffusion time, temperature, and the concentration of the gallium in the diffusion atmosphere. Each of these parameters may vary appreciably, and of course they are interrelated. Specific examples will be given in this specification, which may be used directly by one skilled in the art, or may be used as a starting point for choosing his own parameters empirically to achieve his own specific structure using the criteria given herein.

After the gallium diffusion, the reciprocal region (previously heavily doped with N-type impurities) remains N-type. The proportion of minority carriers to the majority carriers in the reciprocal region is thus increased. A semiconductor device, i.e., an improved transistor, is thus made, having formed therein the following regions: (*a*) a principal collector region of N-type conductivity; (*b*) a base region predominantly of P-type conductivity adjacent to said principal collector region and extending to one planar surface of said body, said base region forming a PN junction with said principal collector region; (*c*) a collector extension region of lower resistivity than said principal collector region adjacent said principal collector region and extending to said planar surface of said wafer, said collector extension region laterally surrounding said base region and containing both donor and acceptor impurities, the acceptor impurity gallium being in lower concentration than the donor impurities, thereby making said collector extension region N-type so as to form a PN junction with said base region, said junction being an extension of the PN junction between said base and principal collector regions to said planar surface; and (*d*) an N-type emitter region extending inwardly from said surface of said base region forming a PN junction therewith extending to said planar surface.

The process of this invention is also useful in the formation of laterally limited resistor regions of very accurate dimensions. These regions are surrounded by low resistivity reciprocal regions. Because of the ability of gallium to be controllably diffused in very low concentrations, the resistivity of the resistor regions can be made higher than heretofore possible using conventional maskable diffusants. Diodes and field-effect devices are also products of the invention. The details of these various devices of this invention, and their method of manufacture will become apparent from the following more detailed description, referring to the drawings, in which:

FIGURES 1–6, schematically illustrate a transistor in successive stages of manufacture, in accordance with the present invention;

FIGURES 7–12, schematically illustrate a semiconductor integrated circuit including an NPN transistor and a resistor of this invention;

FIGURES 13–18, schematically illustrate a semiconductor field-effect device of the invention; and FIGURES 19–23, schematically illustrate a transistor of another embodiment of this invention.

Considering an illustrative example of the process of the present invention, reference is made to FIGS. 1–6 schematically illustrating, in sectional view, a single transistor in successive stages of manufacture. Although transistors are normally formed in multiple units from a single slice or wafer of semiconducting material, the present invention is most easily described in connection with the processing of a single transistor. Consequently, the illustrations are not intended to exclude the simultaneous manufacture of multiple units.

The process commences with a thin slice or wafer 11 of N-type silicon having a suitable concentration of donor impurity dispersed throughout to impart the requisite conductivity type for the collector of a transistor. An integral silicon oxide coating 12 is formed upon the top surface of the wafer 11, preferably by thermal growth by oxidation in accordance with conventional practices. This coating is limited in its lateral extent upon the upper wafer surface to define a desired extent of a transistor base zone in the wafer. Such limitation upon the extent of the coating may be accomplished, for example, by oxidizing the entire surface and then etching away excess portions of the coating over the reciprocal region. As illustrated in FIGURE 1, the limited coating 12, which serves as a mask for the subsequent donor diffusion, is formed with a sufficient thickness normal to the wafer for effectively blocking the diffusion of the group V donor impurities.

Figure 2:
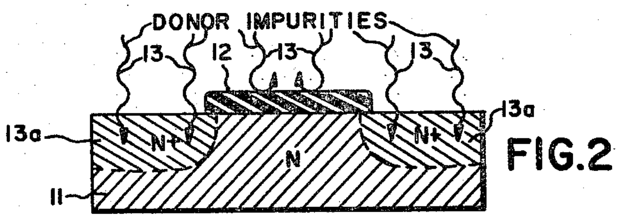

The wafer is then subjected to conventional diffusion processing, wherein a donor impurity, such as phosphorus, is diffused into the upper surface of the wafer. This is illustrated in FIGURE 2 by the arrows 13 directed downwardly onto such upper surface. Mask 12 substantially prevents diffusion of this donor impurity into the wafer beneath the mask. Using the N-type silicon wafer 11 as shown, the diffusion of further donor impurities into the region **13*a* around the mask, termed the reciprocal region, will produce an increased donor impurity concentration (labeled N+ in FIGURE 4) in that reciprocal region 13*a***.

Figure 3:
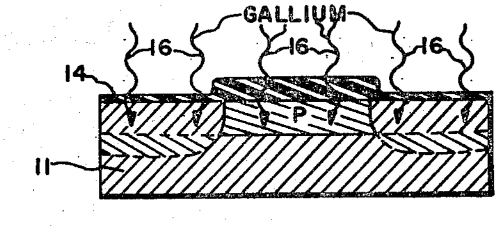

During diffusion processing it is normal for a certain amount of additional silicon oxide to be grown upon the wafer surface. In FIGURE 3 and subsequent figures, this regrown oxide is shown as a masking 14 of lesser thickness than the original mask 12. Inasmuch as gallium readily diffuses through silicon oxide, the mask 12 and, of course, the thin extensions 14 thereof, do not materially reduce the diffusion rate of gallium in the subsequent gallium diffusion.

The next step is to diffuse gallium into the upper surface of the wafer, as indicated by the arrows 16 in FIGURE 3. Because of the failure of silicon oxide to mask gallium, as specified above, the gallium impurities are dispersed over the entire surface of the wafer. The gallium diffusion must be carried out under conditions to produce a sufficient gallium concentration beneath the mask 12 to establish a P-type region within the wafer to be used as the base of the transistor. However, this P-type region must be shallow enough so as not to extend beneath the reciprocal region **13*a* (FIGURE 2). In other words, an N+ region 13*b* (FIGURE 4) beneath the N region 13*c* must be left substantially unaffected by the gallium.. The drawings, of course, are greatly exaggerated. The actual thickness of the N+ region 13*b* might be a fraction of a micron. In fact, if diffusion could be controlled accurately enough, the depth of the P-type base region 17 could be exactly the depth of N+ region 13*a*. However, it is essential that the P-type region 17 does not extend beyond the border between N+ region 13*b* and substrate 11. If that happened, the base region would extend the entire width of the wafer, and there would be no way of making contact with the collector region from the surface of the wafer, as required to achieve the desired planar transistor. Therefore, controlling the depth of the gallium diffusion to form a P-type region 17 laterally limited by the reciprocal region 13*a*** is the essence of the invention.

Although the same amount of gallium is diffused into region **13*a* as into region 17, the net result of the gallium diffusion (acceptor) into region 13*c* is to, in part, counteract the excess donor impurities previously diffused. Therefore, the upper part 13*c* of previously N+ reciprocal region 13*a* becomes N-type, while the previously N-type region 17 becomes P-type. The P-type region 17 beneath mask 12** extends from the upper surface of the wafer inwardly to a depth less than (or equal to) the depth of the original donor diffusion.

The initial donor diffusion to form reciprocal region **13*a*** may be a total of a few hours long at elevated temperatures in the range of about 600–1000°. It is common practice to predeposit the donor impurity on or into the surface of the water from a vapor, and then to heat the wafer in an inert or oxidizing atmosphere to complete the diffusion of the donor impurities into the wafer. After the formation of the reciprocal region in the above manner, gallium, generally from gallium sesquioxide crystals, is vaporized, and decomposed into elemental gallium vapor by hydrogen. This gallium is then diffused at temperatures in the range of 900–1200° C. into the wafer. The time and temperature are regulated so that the diffusion depth does not exceed the previous donor diffusion depth—augmented by the depth of any simultaneous additional donor diffusion taking place during the gallium diffusion. The times and temperatures used can be ascertained empirically, or from the specific examples to follow.

Figure 4:
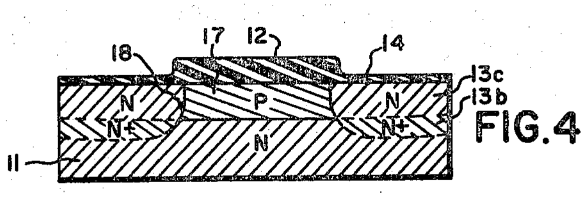
Figure 5:
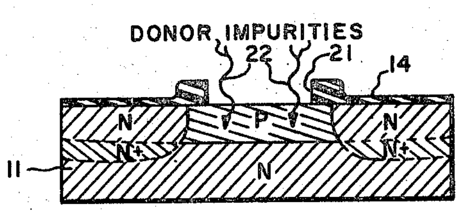
Figure 6:
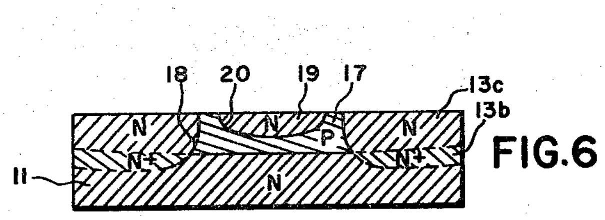
Figure 7:
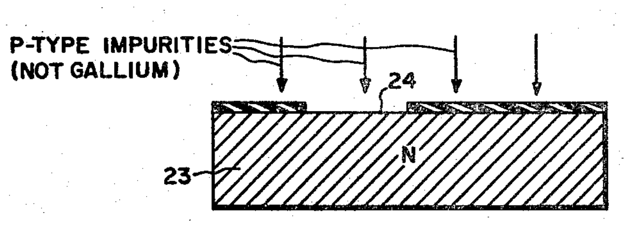

It will be appreciated that the semiconductor configuration illustrated in FIGURE 4 of the drawing comprises the basic components of a silicon planar diode, and consequently, may be used as such by the attachment of ohmic contacts to the two regions 17 and 13$c$ at the upper surface of the wafer. The oxide is removed beneath such contacts. Alternatively, where it is desired to proceed with the processing for the manufacture of a transistor, the mask 12 is apertured, as indicated in FIGURE 5. The aperture 21, formed in the mask 12, is aligned to define the lateral extent of the transistor emitter. An oxide-masked donor impuritiy, such as phosphorus, is diffused into the wafer through aperture 21, as indicated in FIGURE 5 by the arrows 22. As seen in FIGURE 6, the diffusion of a suitable concentration of donor impurities into the P-type region of the wafer produces a reversal of the conductivity type in region 19 to establish an N-type emitter within the P-type base region 17 of the transistor. An emitter-base junction 20 formed about the emitter will be seen to extend to the upper surface of wafer 11 to complete the planar transistor blank.

The completed transistor blank shown in FIGURE 6 has had the oxide coating removed. The collector region 11, the base region 17, and the emitter region 19, each extend to the upper surface of the wafer. With this configuration, very minute zone dimensions may be attained in order to materially enhance the high frequency applicability of the transistor. In accordance with conventional practices, suitable ohmic contacts may be made to the separate zones of the transistor, completing the device. The illustration of FIGURE 6 shows the silicon oxide having been removed from the transistor, although such coating or masking may be retained over at least portions of the upper surface of the wafer in order to protect and insulate the transistor junctions upon such surface.

The contacts with the collector region 11 are made from the surface through low resistivity regions 13$c$ and 13$b$ (FIGURE 6). The resistivity of these regions was decreased from that of the original wafer by the donor diffusion. Therefore, these regions provide a low resistance path from the surface of the device to the collector region to substantially reduce the voltage drop otherwise caused by the connection between the top surface and the collector. Additionally, if aluminum is used for the metal ohmic contacts at the surface to the reciprocal region, a better ohmic contact can be made to a low resistivity region than to a high resistivity region. Therefore, in addition to their purpose in laterally limiting the extent of the base region formed by the gallium diffusion, the reciprocal regions serve a very useful purpose in the completed device.

The following examples are included to show certain specific conditions which are operative for the invention and which produce a useful device. However, as long as the depth relationships are maintained between the regions, the actual conditions employed are within the skill of the art. Therefore, these examples are not intended to place limitations on the scope of the invention not expressed in the claims.

*Example I*

A wafer uniformly doped to about $10^{16}$ atoms/cc. with impurities producing N-type conductivity was oxidized to provide a uniform oxide coating on the surface. A portion of the oxide was then etched away using conventional photoetching to leave a pattern of oxide on the surface for masking, as shown in FIGURE 1. The surface of the wafer was exposed to phosphorus pentoxide vapor in an inert atmosphere of nitrogen gas. The phosphorus was obtained by heating an excess of phosphorus pentoxide (generally at least about 2 g.) to about 220° C. in a separate vessel and passing the effluent phosphorus pentoxide vapor into the nitrogen atmosphere in the furnace containing the wafer. The nitrogen flow rate was maintained at about 160 cc./min. The phosphorus pentoxide molecules are dissociated into elemental phosphorus atoms during the diffusion into the wafer.

The furnace was maintained at a temperature of about 808° C. for thirty minutes. This time span was sufficient to cause phosphorus to prediffuse into the surface of the wafer slightly. At the end of the thirty minutes, the wafer was removed from the furnace, and placed into a furnace having an oxygen atmosphere at a temperature of about 1201–1204° C. for 2½ hours. The oxygen atmosphere caused oxidation of the wafer surface to form the oxide configuration on the surface shown in FIGURE 3. The total depth of the diffusion of phosphorus, as shown by regions 13$a$ in FIGURE 2, was about 6.7–7 microns after both of the above steps.

Next, gallium diffused into the water in one step. Gallium sesquioxide (also in excess) was heated at about 1100° C. and the effluent vapor passed into a furnace containing the water. The decomposition of the gallium sesquioxide was effected by simultaneously passing a gaseous mixture of nitrogen (at 700 cc. per minute) and hydrogen (at 40 cc. per minute) into the furnace maintained at about 1153–1154° C. This diffusion was continued for about 85 minutes. At the end, the depth of the gallium (P-type) region was about 2½ microns. During the gallium diffusion, the phosphorus from the previous diffusion continued to diffuse slightly, adding about ½ micron to its previous depth. Therefore, at the end of the gallium diffusion, the phosphorus depth was just over 7 microns and the gallium depth 2½ microns. It is apparent that the gallium was a much shallower diffusion, as required by the invention.

Finally, to complete the transistor, a hole was etched in the oxide over the base region and an emitter was formed in the P-type base region by diffusion phosphorus to a depth of just under 2 microns in the same manner, but for a much shorter time than the previous phosphorus diffusion. Since the gallium simultaneously diffused a few tenths of a micron more, about .7–.8 micron of base region were left below the emitter. Contacts were then applied by evaporation and etching, and the device was tested. This device operated satisfactorily in all respects as a transistor.

*Example II*

The same process as above was carried out, changed only by shortening the initial phosphorous diffusion (after the initial predeposition) from 2½ hours above to about 1 hour at a temperature of 1105° C. The depth of the phosphorus under these conditions at the end of this diffusion was just under 3 microns.

During the gallium diffusion, however, the phosphorus diffused about an additional 2 microns in the same 85 minute time interval as before. The depth of the gallium diffusion was again about 2½ microns. Consequently, the N-type regions extended 2½ microns below the gallium—a sufficient amount for the purposes of this invention. This example illustrates that because the N-type impurities of the reciprocal region will diffuse deeper during the gallium diffusion, the depth of the initial diffusion may be reduced. In fact, the initial diffusion of the reciprocal region can be slightly shallower than the intended gallium depth, because there will be the additional diffusion of the reciprocal region concurrent with the gallium diffusion, which will maintain the depth of the reciprocal region below the gallium depth.

At this point, it is helpful to compare the process of this invention with the now conventional planar process of the Hoerni patent referenced above. A principal advantage of the process of this invention over the nonconventional planar techniques used by Hoerni is the ability to form a junction beneath a level oxide layer. After the diffusion of the reciprocal region (shown in FIGURE 3), but before the gallium base diffusion, the entire oxide layer may be removed by conventional etching methods, and a new, level oxide layer regrown. Then, the gallium may be diffused to form the junction beneath, but extending up to the level oxide layer. This level oxide is very advantageous when leads are to be metallized over the oxide layer, as described in U.S. Patent 2,981,877 of Robert N. Noyce, assigned to the same assignee as this invention. Of course, in the conventional planar process, the oxide layer may be removed and regrown after the formation of the junction or junctions; however, this tends to increase leakage currents at the surface of the device which impair the characteristics of the devices. When the undulant oxide layer is removed prior to the junction formation, as in the method of this invention, no additional problems with leakage currents arise.

With the conventional planar processing, the regions surrounding the base region—to be used for collector contact at the top surface of the wafer—have the same degree of resistivity as the original wafer (generally high). These regions are masked during the prior diffusions. With the process and devices of this invention, however, these regions are made very low resistivity, without the necessity of an additional diffusion. Therefore, the method and devices hereof present an additional advantage over the prior art.

Figure 8:
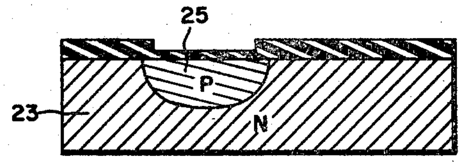

Oxide removal and regrowth has been used in the embodiment of this invention shown in FIGURES 7–12, depicting the manufacturing steps of a semiconductor integrated circuit including a transistor and a resistor according to the method of this invention. As before, the process begins with a monocrystalline wafer of semiconductor material 23 (e.g., silicon), having an oxide coating grown on one surface. An aperture 24 has been etched in the oxide by usual photoetching processes for the diffusion of the base region. This base region is formed by the conventional planar process, although it will be apparent that the resulting structure shown in FIGURE 8 could have been equally well prepared according to the method hereof (see FIGURE 5, which shows a similar structure made according to this invention). In the conventional process, a P-type diffusant which may be oxide masked (not gallium) is diffused into the aperture 24 to form the base region 25 (FIGURE 8).

Figure 9:
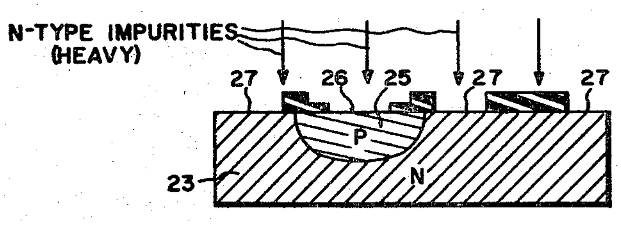

After the base diffusion produces the structure of FIGURE 8 having base region 25, additional apertures are etched in the oxide as shown in FIGURE 9 for the simultaneous formation of the emitter region and the reciprocal regions required for the subsequent donor diffusion of the resistor. Aperture 26 is used for the emitter diffusion, and apertures 27 for the reciprocal region. N-type donor impurities are then diffused into the apertures (masked by the oxide), as shown in FIGURE 9. The resulting wafer, shown in FIGURE 10, has emitter region 28 diffused into base region 25, forming emitter-base junction 29 between them. The N+ heavily-doped, reciprocal regions 30 are to be used to restrict the lateral extent of the resistor to be formed by a gallium diffusion.

Figure 10:
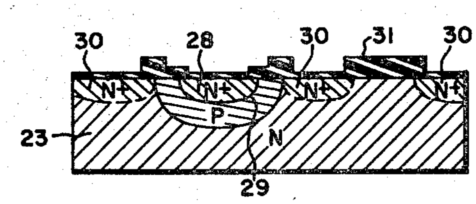

Although not absolutely necessary, in the embodiment of FIGURES 7–12, the entire undulated oxide surface 31 in FIGURE 10 was stripped from the wafer by a conventional photoetching process. This oxide was then regrown to form the level oxide layer 32 shown in FIGURE 11. This level oxide is very desirable in the integrated circuit structure, because it provides a uniform substrate of sufficient thickness to permit the deposition of metallized interconnections between circuit elements on the surface of the device.

Figure 11:
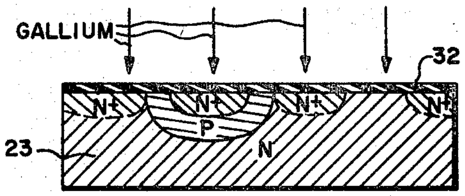
Figure 12:
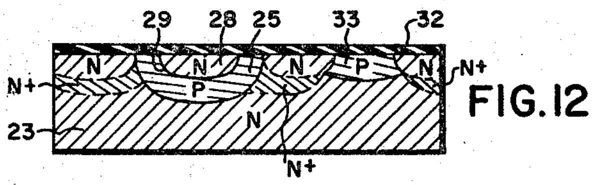

As the last step in the process, gallium is diffused through the level oxide coating 32 as shown in FIGURE 11. The gallium diffusion, carried out in a reducing atmosphere, in no way affects the desirable level oxide layer. A resistor is normally a lightly doped region (e.g., $10^{16}$ to $10^{19}$ atoms per cc.). Therefore, the gallium diffusion which imparts a rather low but controllable concentration of acceptor impurities at the surface of the wafer, does not appreciably compensate the donor majority carrier concentration in emitter region 28. However, the concentration of the gallium will be sufficient to convert region 33 from N- to P-type conductivity to form a diffused resistor of the opposite conductivity type from the wafer. Because of the possibility of extremely accurate control of gallium diffusions, the resistance of region 33 may be accurately chosen to very fine tolerances. Such accuracy is not possible with other normally used diffusants, e.g., boron. Again, according to the invention, the minority carrier concentration in the N-type reciprocal regions 30 is increased, but not sufficiently to change their conductivity type.

If the P-type resistor 33 were formed conventionally, such as during the diffusion of P-type base region 25, the maximum sheet resistance possible by normally used techniques is about 200 ohms per sq. With the method of this invention, sheet resistance in excess of 1000 ohms per sq. have been found possible. The main problem with the conventional simultaneous base and resistor diffusion is that the base region has to be made sufficiently deep so that an emitter region may be diffused into it while still leaving a layer of base between emitter and collector (see FIGURE 10, for example). Moreover, the base is generally desired to be lower resistivity than the resistor, making it difficult to form them in the same diffusion operation. The process of this invention, illustrated in FIGURES 7–12, makes possible the formation of a very high resistivity resistor without the necessity of an additional masking step, because the reciprocal regions are formed in the same diffusion as the emitter.

Figure 13:
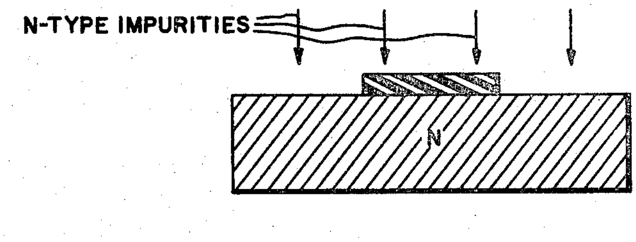
Figure 14:
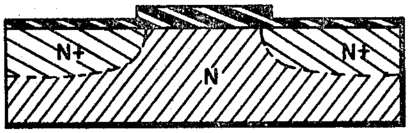
Figure 15:
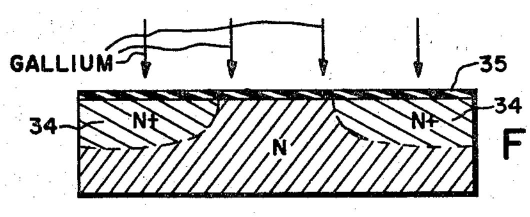
Figure 16:
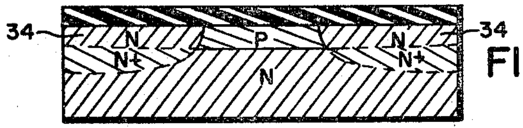
Figure 17:
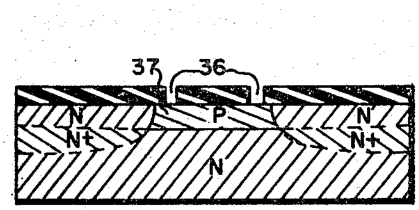
Figure 18:
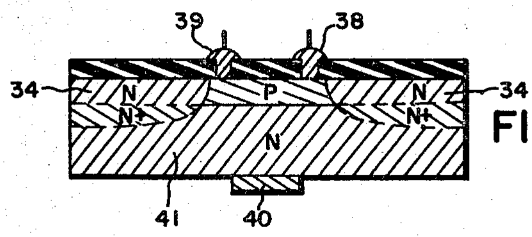

The method of this invention provides a very advantageous way of making field-effect devices. A field-effect device requires a high resistivity channel region of accurate dimensions. FIGURES 13–15 depict the formation of the reciprocal regions 34 in the same manner as was done in FIGURES 1–2. Gallium is then diffused into the surface of the wafer. Prior to the gallium diffusion, the oxide surface layer was etched away in this illustrated embodiment, and a new, planar layer 35 was regrown. This has the advantages mentioned above. The device after the gallium diffusion is shown in FIGURE 16. Apertures 36 are then etched in the planar oxide layer as shown in FIGURE 17 for the formation of channel contacts, one on either end of channel region 37. These contacts are then deposited or evaporated by conventional metallizing techniques. Generally, aluminum or other suitable metal is deposited over the entire surface of oxide layer 35. Superfluous portions are then etched away, leaving the contacts 38 and 39 shown in FIGURE 18. Gate contact or electrode 40 may be deposited in any conventional way to make contact with N-type gate region 41. This contact may be on the bottom surface, as shown, or adjacent to reciprocal region 34. The field-effect device is then complete.

When gate contact is to be made from the top surface through reciprocal region 34, the devices of this invention are particularly advantageous. The extra concentration of impurities in the reciprocal region substantially reduce the resistivity of that region. Therefore, the voltage drop between the top surface of the wafer and the effective gate area is appreciably reduced.

The method of this invention may be combined, if desired, with a process of the prior art described in the Derick et al. patent mentioned earlier. In the Derick et al. process, it will be recalled, an N-type emitter was diffused, and then the base subsequently diffused to a depth in excess of the emitter, thus leaving two junctions. The emitter-base junction extended to the surface of the device but the base-collector junction was beneath the wafer surface and was coextensive with the lateral dimensions of the wafer. One essential difference between the two processes was the diffusion depth of the gallium. In the Derick et al. patent, that depth was greater than the previous emitter diffusion depth; in this invention, that depth is less than the previous reciprocal region diffusion depth. The method illustrated in FIGURES 19–23 combines both methods to achieve a planar transistor having both junctions extending to the surface.

Figure 19:
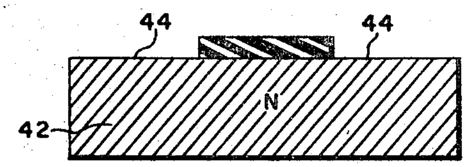
Figure 20:
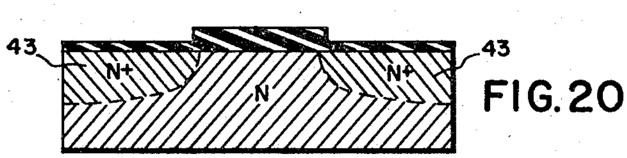
Figure 21:
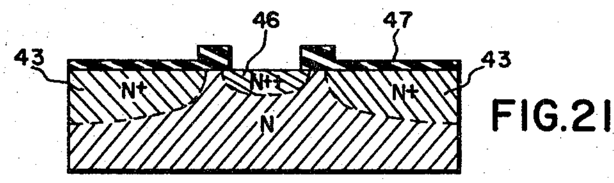

In FIGURE 19, wafer 42 is shown of N-type silicon. As in earlier embodiments, reciprocal regions 43 are diffused into apertures 44 (FIGURES 19 and 20). At this stage, an additional aperture 45 is etched in the oxide coating 46, and N-type impurities are diffused into the wafer (which impurities are masked by the oxide except at the aperture 45). These impurities form the emitter region 47. The concentration of N-type impurities in the emitter region is quite large (designated N++) so that there will still be a high concentration of majority carriers even after the subsequent gallium acceptor diffusion.

Note that the depth of the reciprocal region is greater than the emitter region. This is because the same gallium diffusion must penetrate beneath the emitter region 47, but not beneath reciprocal region 43. The oxide may then be removed and regrown, as described above and shown in FIGURE 22.

Figure 22:
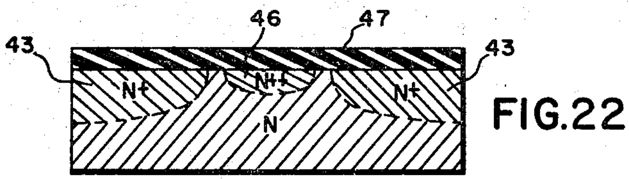
Figure 23:
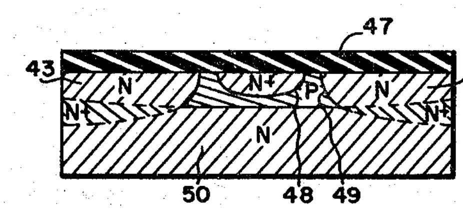

As shown in FIGURE 22, gallium is diffused through the newly formed, level oxide coating 47. The resulting structure has two junctions 48 and 49, both extending to the surface of the wafer. Emitter-base junction 48 is formed by the method of Derick et al. by a gallium diffusion deeper than the previous emitter diffusion. The base-collector junction 49 is formed by the method of this invention by gallium diffusion shallower than the depth of the previous diffusion of reciprocal regions 43. Note that the last junction formation was beneath a level oxide layer 47. Therefore, the final device again has a flat surface for the deposition of leads, contacts, and the like. It is also provided with a low resistivity region 43 surrounding the base region at the surface of the wafer for making a low-resistance contact with the collector region 50. This low resistivity region thus reduces collector spreading resistance.

From the foregoing, it will be appreciated that the present invention is particularly directed to the manufacture of silicon semiconducting devices wherein an N-type silicon wafer or blank is originally employed, and into which an acceptor impurity is diffused to form a P-type region within the wafer. This is accomplished by defining the lateral extent of such desired P-type region with a silicon oxide mask over the wafer surface, followed by an initial diffusion of additional donor impurities into the wafer which forms a reciprocal region having an excess concentration of donor impurities in the upper surface of the wafer about the mask. Subsequently, gallium is diffused into the wafer through the mask and into the entire upper surface of the wafer. This diffusion is continued until the desired volume of wafer beneath the mask is converted to a P-type region. However, the depth of the PN junction thus formed must be above or equal to the previous depth of the reciprocal region in order that the lateral extent of the P-type region formed is limited by the boundaries of the reciprocal region. This gallium diffusion serves to reduce the overconcentration of donor impurities in the reciprocal region so as to return most of the reciprocal region to somewhat the same impurity concentration as original wafer. The reciprocal region serves to prevent the gallium from changing the entire wafer surface area into a P-type semiconductor. The masking used for the reciprocal region will thus be seen to be the opposite or negative configuration from conventional manufacturing processes. The mask covers the area where the diffused region is to be formed, rather than, as usual, the region where it is not formed.

Substantial advantages are obtained with the process of the present invention, inasmuch as gallium is a highly desirable and controllable acceptor impurity for diffusion processing. Prior to the present invention, it was most difficult, if not impossible, to utilize gallium for diffusion processing wherein lateral limitations upon the region formed by the gallium diffusion were of importance. This is particularly true in planar transistors, for example, wherein each of the transistor zones extends to a single surface of the wafer. The advantages of silicon oxide masking and of gallium diffusion are herein combined to produce a new device representing a substantial advancement in the art. Because of the many obvious modifications in the specific process steps and devices described above which are apparent to those skilled in the art, the scope of the invention should not be limited except as defined in the claims which follow.

What is claimed is:

1. An improved method of forming a transistor comprising the steps of:
   (*a*) masking a portion of one surface of an N-type silicon wafer with silicon oxide to define the lateral extent of the P-type base region to be formed thereunder and to leave an exposed portion of the surface for the diffusion of a donor impurity;
   (*b*) diffusing a donor impurity which is masked by silicon oxide into the wafer from said surface to establish a reciprocal region in said wafer of a predetermined depth having additional donor impurities surrounding the masked portions of said wafer;
   (*c*) controllably diffusing a gallium into the wafer to establish a P-type zone in said wafer beneath said mask of depth less than said predetermined depth, the amount of such gallium diffused being insufficient to change the conductivity type of said reciprocal region from N-type to P-type, whereby a PN junction is formed between said P-type base region and said wafer, said junction extending to the wafer surface between said base zone and said reciprocal region;
   (*d*) masking the remainder of the surface of said wafer except a portion of the surface of said base region with silicon oxide, leaving an aperture in said mask over the base region for the diffusion of an emitter region; and
   (*e*) diffusing N-type impurities masked by silicon oxide into said aperture to form an emitter region of N-type conductivity, said emitter region forming a PN junction with said base region extending to said surface.

2. The method of claim 1 further defined by the additional step of forming ohmic contacts to the surface of each of said base, emitter, and reciprocal regions for making electrical contact with the base, emitter, and collector regions of said transistor, respectively.

3. The method of claim 1 further defined by the additional steps of the removal of the oxide masking layer and any oxide formed during the first donor impurity diffusion and the regrowth of a level oxide layer prior to said gallium diffusion, whereby said oxide layer will remain level after said gallium diffusion.

4. An improved method of forming a transistor comprising the steps of:
   (*a*) masking a portion of one surface of an N-type silicon wafer with silicon oxide to define the lateral extent of the P-type base region to be formed thereunder and to leave an exposed portion of the surface for the diffusion of a donor impurity;
   (*b*) diffusing a donor impurity which is masked by silicon oxide into the wafer from said surface to establish a reciprocal region in said wafer of a predetermined depth having additional donor impurities surrounding the masked portion of said wafer;
   (*c*) forming an aperture in said silicon oxide surface layer, including said mask and the oxide formed during said donor diffusion, said aperture being interior of and spaced apart from the surrounding surface of said reciprocal region;
   (*d*) diffusing a donor impurity which is masked by silicon oxide into the wafer from said surface to establish an emitter region having additional donor impurities in said wafer of a depth less than said predetermined depth, and (e) controllably diffusing gallium into the wafer to establish a P-type base region in said wafer beneath said mask of depth greater than the depth of said emitter region but less than said predetermined depth, the amount of such gallium diffused being insufficient to change the conductivity type of said emitter and reciprocal regions from N-type to P-type, whereby PN junctions are formed between said P-type base region and said wafer, and between said P-type base region and said emitter region, said junctions extending to the wafer surface between the said respective regions.

5. The method of claim 4 further defined by the additional step of forming ohmic contacts to the surface of each of said base, emitter, and reciprocal regions for making electrical contact with the base, emitter, and collector regions of said transistor, respectively.

6. The method of claim 4 further defined by the additional steps of the removal of the oxide masking layer after both donor impurity diffusions, and the regrowth of a level oxide layer prior to said gallium diffusion, whereby said oxide layer will remain level after said gallium diffusion.

7. An improved method of forming a transistor comprising the steps of:

(a) masking a portion of one surface of an N-type silicon wafer with silicon oxide, leaving an aperture in said mask to define the lateral extent of the emitter region to be formed thereunder and to leave an exposed portion of the surface for the diffusion of a donor impurity;

(b) diffusing a donor impurity which is masked by silicon oxide into the wafer from said surface to establish an emitter region having additional donor impurities in said wafer extending to a predetermined depth;

(c) forming a second aperture in said silicon oxide surface layer, including said mask and the oxide formed during said donor diffusion, said aperture being exterior of and spaced apart from the surface of said emitter region;

(d) diffusing a donor impurity which is masked by silicon oxide into the wafer from said surface to establish in said wafer a reciprocal region of a depth greater than said predetermined depth having additional donor impurities; and (e) controllably diffusing gallium into the wafer to establish a P-type base region in said wafer beneath said mask of a depth greater than said predetermined depth but less than the depth of said reciprocal region, the amount of such gallium diffused being insufficient to change the conductivity type of said emitter and reciprocal regions from N-type to P-type, whereby PN junctions are formed between said P-type base region and said wafer, and between said P-type base region and said emitter region, said junctions extending to the wafer surface between the said respective regions.

8. The method of claim 7 further defined by the additional step of forming ohmic contacts to the surface of each of said base, emitter, and reciprocal regions for making electrical contact with the base, emitter, and collector regions of said transistor, respectively.

9. The method of claim 7 further defined by the additional steps of the removal of the oxide masking layer after both donor impurity diffusions, and the regrowth of a level oxide layer prior to said gallium diffusion, whereby said oxide layer will remain level after said gallium diffusion.

10. An improved method of forming an integrated circuit including a transistor and a resistor, which comprises the steps of:

(a) masking a portion of one surface of an N-type silicon wafer, having a P-type base region diffused therein and forming a PN junction with said wafer which extends to said surface, with silicon oxide to define the lateral extent of a P-type resistor to be formed thereunder, and also covering said base region, said mask having an aperture in the portion covering said base region to permit the diffusion of an emitter region therethrough;

(b) diffusing a donor impurity which is masked by silicon oxide into said wafer from said surface to establish an N-type emitter region within said P-type base region forming a PN junction therebetween which extends to said surface, and also to establish a reciprocal region having additional donor impurities in said wafer of a predetermined depth surrounding said defined lateral extent of said resistor, and (c) controllably diffusing gallium into the wafer to establish a P-type resistor region in said wafer beneath said mask of depth less than said predetermined depth, the amount of such gallium being diffused being insufficient to change the conductivity type of said emitter and reciprocal regions from N-type to P-type, whereby PN junctions are formed between said P-type base region and said wafer, and between said P-type base region and said emitter region, said junctions extending to the wafer surface between the said respective regions.

11. The method of claim 10 further defined by the additional steps of forming ohmic contacts to the surface of each of said base, emitter, and reciprocal regions for making electrical contact with the base, emitter, and collector regions of said transistor, respectively, and forming two ohmic spaced contacts with the surface of said resistor, whereby a resistance to current flow is provided between said two ohmic contacts.

12. The method of claim 10 further defined by the additional steps of the removal of the oxide masking layer after said donor impurity diffusions, and the regrowth of a level oxide layer prior to said gallium diffusion, whereby said oxide layer will remain level after said gallium diffusion.

References Cited by the Examiner

UNITED STATES PATENTS

| | | | |
|---|---|---|---|
| 2,802,760 | 8/57 | Derick | 148—33.5 |
| 2,910,394 | 10/59 | Scott | 148—1.5 |
| 2,931,743 | 4/60 | Rittman | 148—1.5 |
| 2,954,486 | 9/60 | Doucette | 148—186 |
| 2,981,877 | 4/61 | Noyce | 148—33.3 |
| 3,036,250 | 5/62 | Bender | 317—234 |
| 3,059,123 | 10/62 | Pfann | 148—106 |
| 3,069,604 | 12/62 | Ruehrwein | 317—234 |
| 3,147,152 | 9/64 | Mendel | 148—186 |

FOREIGN PATENTS

| | | |
|---|---|---|
| 1,172,813 | 2/59 | France. |

DAVID L. RECK, *Primary Examiner.*

HYLAND BIZOT, *Examiner.*